Aug. 22, 1967 G. W. GOBELI ETAL 3,337,438

STABILIZATION OF SILICON SEMICONDUCTOR SURFACES

Filed Oct. 23, 1963 2 Sheets-Sheet 1

INVENTORS G. W. GOBELI
J. R. LIGENZA
BY [signature]
ATTORNEY

Aug. 22, 1967 G. W. GOBELI ET AL 3,337,438

STABILIZATION OF SILICON SEMICONDUCTOR SURFACES

Filed Oct. 23, 1963 2 Sheets-Sheet 2

United States Patent Office 3,337,438
Patented Aug. 22, 1967

3,337,438

STABILIZATION OF SILICON SEMICONDUCTOR SURFACES

Garth W. Gobeli, Plainfield, and Joseph R. Ligenza, Califon, N.J., assignors to Bell Telephone Laboratories, Incorporated, New York, N.Y., a corporation of New York Filed Oct. 23, 1963, Ser. No. 318,282
6 Claims. (Cl. 204—164)

This invention relates to a new method for growing an oxide film on a silicon surface. A particularly useful application of the invention is the passivation of silicon diffused junction devices.

The processing of semiconductor devices, and in particular junction devices such as transistors, generally requires some method of passivating the semiconductor surface. This is required principally to protect the device against stray leakage currents which otherwise form on the surface of the semiconductor under humid or similar adverse conditions.

The current commercial method of passivating semiconductor devices involves the high temperature oxidation of the semiconductor surface. This is achieved by baking the device in oxygen or steam. Temperatures encountered are of the order of 1000° C. Processing quality devices at such severe temperatures is a well known, but generally tolerated, disadvantage since the junction properties are often adversely affected and the step of attaching the electrodes to the device must follow the passivating treatment with well known attendant processing complications. Specifically, in the latter connection, a complex procedure of applying a resist, and etching the passivating oxide film from the regions to which the electrodes are attached is usually employed. Since it is particularly difficult to etch the contact regions uniformly, the device often shows an area of reduced film thickness adjacent to the electrodes.

The present invention eliminates both the junction diffusion problem and the need for a post oxidation etching process. According to this invention, the silicon surface can be oxidized at temperatures which do not affect the diffused junction nor the electrode attachment, consequently a completely finished silicon junction device can be passivated with no adverse effects.

The new silicon oxidation process is carried out by placing the silicon body in contact with a moderate density oxygen glow discharge which is supported by a microwave source. It is thought that the negative oxygen ion is responsible for the oxidation observed and that the ionized gas discharge or plasma is rich in this ion species. Limited thicknesses of oxide film can be grown by merely placing the silicon body in contact with the oxygen discharge. If a potential is applied across the plasma with the silicon body on the anode in order to extract the negative ions, the film will grow parabolically with no limiting thickness.

Various aspects of the invention may become more clear when considered in conjunction with the drawing, in which.

Figure 1:
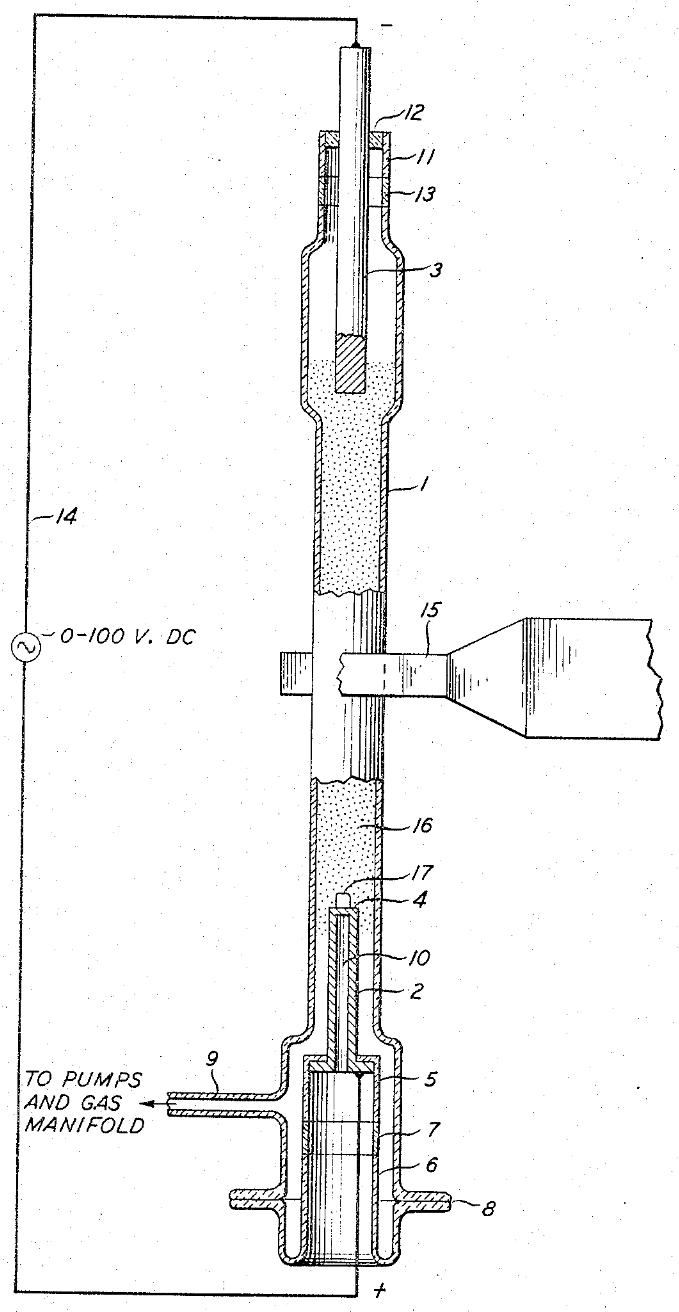
FIG. 1 is an elevated and partly sectional view of a typical laboratory oxidation apparatus.

The laboratory apparatus shown in FIG. 1 is comprised of a quartz discharge tube 1 of 1.3 cm. I.D. fitted with two silicon electrodes 2 and 3. Electrode 2 is a hollow cylinder of 0.1 ohm-cm. p-type silicon, 1.27 cm. in diameter with a sealed end to provide a work surface at 4. The electrode 2 is attached to a hollow cylinder of quartz 5 which is attached to a hollow cylinder of Pyrex glass 6 via a graded glass seal at 7. The whole pedestal is attached to the discharge tube by a flange at 8 with the use of Apiezon "W" wax. The line 9 running into the discharge tube leads to the vacuum pump (not shown) and to the oxygen gas manifold (not shown). The hollow inside of the electrode 2 provides a well 10 for temperature measurement and/or for cooling water.

The electrode 3, of the same size and material as electrode 2, is attached to a hollow cylinder of Pyrex glass 11 at the cylinder's closed end 12 and the Pyrex cylinder is attached to the discharge tube 1 via a graded glass seal 13. The ends of the two electrodes are 25 cm. apart. Line 14 attached to electrodes 2 and 3 runs to a direct current source capable of potentials up to 100 volts. The microwave generator (not shown) is coupled to the discharge tube 1 with a resonant cavity assembled from a tapered waveguide 15 and a double-slug tuner (not shown). The waveguide 15 surrounds the discharge tube on three sides. The generator is a 2450 mc. Raytheon Model PGM-100CW capable of generating 300 to 1000 watt microwave power.

In general, the discharge tube, and the electrodes can be made of many materials. Quartz is a preferred material for the discharge tube since it can withstand the temperature of the gas discharge. Silicon is a preferred material for the electrodes because it has a low sputtering yield and can be easily degassed.

The discharge tube dimensions, and the design, power and frequency of the microwave assembly are variable. All that is necessary is that the assembly produce a sufficiently ionized glow discharge 16 that will contact the silicon body 17 on the work surface 4.

A typical oxidation with the apparatus shown in FIG. 1 is carried out as follows. A silicon body 17 is placed on the work surface 4 and the electrode assembly is attached to the discharge tube via flange 8. After the discharge tube has been evacuated to approximately $10^{-6}$ torr, oxygen gas is admitted through tube 9 to a pressure of 0.4 to 1.5 torr. The microwave generator is turned on and a discharge is established. The initial discharge is usually found by spectral analysis to have impurities such as CO, $CO_2$ and $H_2O$. If the gas is pumped out and the discharge reestablished a few times, a pure oxygen discharge can be obtained. At this stage only the spectral lines of various oxygen species can be found.

A glow discharge can be characterized by its saturation current density. This parameter can be determined by the method of Johnson and Malter found in Physical Review 80, 58 (1950). For a given degree of ionization of the oxygen plasma, there will be a certain voltage applied to a double probe system immersed in the plasma beyond which there is no increase in current flow over the circuit of the double probe system. This current flow value divided by the cross-sectional area of the discharge tube is the saturation current density. Although an oxygen plasma with almost any saturation current density will oxidize, the preferable range of saturation current densities for purposes of this new process is from approximately 0.1 ma./cm.$^2$ to 100 ma./cm.$^2$. In a plasma with a saturation current density below the lower limit of this range, the rate of oxidation of the silicon becomes very small. Above the upper limit, the plasma becomes too hot and the low temperature advantage of the process is lost.

Although almost any pressure of oxygen gas in the container will give oxidation, the preferable range is from 0.01 mm. Hg to 10 mm. Hg. Below 0.01 mm. Hg, there is not enough gas to absorb the radiation energy released by ionization and this radiation damages the silicon device. Above the upper limit the plasma against becomes too hot. At a gas pressure of 0.5 mm. Hg and a generator power level of 300 watts, a thermocouple attached to the outside of the central quartz cylinder 1 in FIG. 1 will read about 430° C., while a thermocouple in the well 10 of the anode in FIG. 1 will read 270° C. The temperature of a silicon disk on the work surface 4 is estimated to be between these two values.

Figure 2:
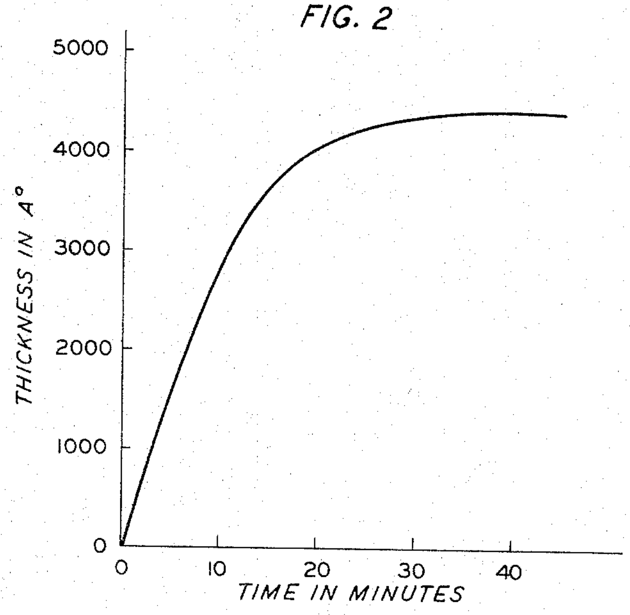
FIG. 2 is a graph showing the growth rate of a silicon dioxide film without the application of an extracting potential.

As mentioned before, if the silicon body is merely in contact with the glow discharge 16, the oxide film will grow but will stop at some limiting thickness. FIG. 2 shows the oxidation rate of a 0.1 cm. thick, 50 ohm-cm. p-type silicon disk placed in the typical laboratory apparatus shown in FIG. 1 with an oxygen pressure of 0.5 mm. Hg and microwave power set at 300 watts. Other typical 0.1 cm. thick samples also reached a limiting thickness of 4000 A. to 5000 A. in 30 to 40 minutes.

Figure 3:
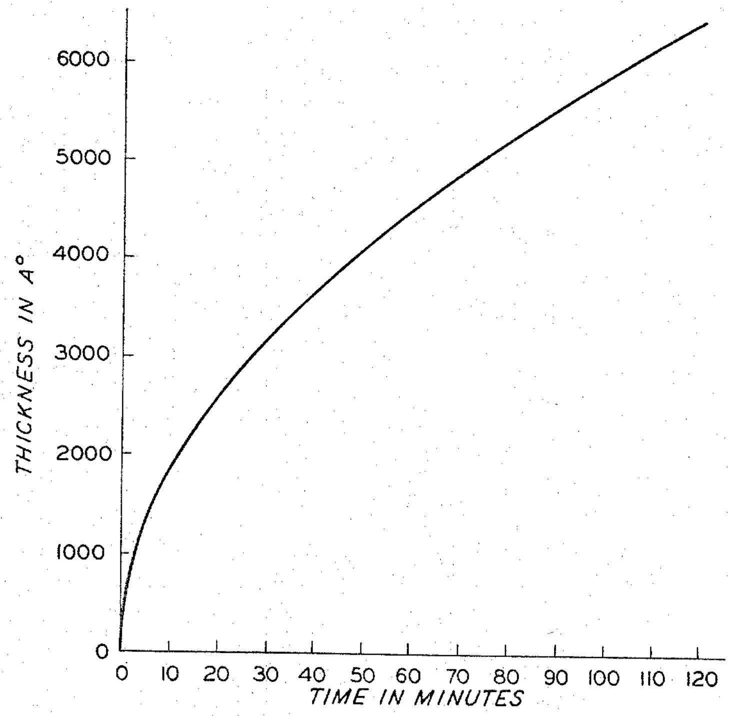
FIG. 3 is a graph showing the growth rate of a silicon dioxide film with the application of an extracting potential.

If an extracting direct-current potential is applied across the plasma, for example, across the electrodes 2 and 3 in FIG. 1, and the silicon body is placed on the anode, the oxide film does not have a limiting thickness. FIG. 3 shows the oxidation rate of one particular 0.05 cm. thick, 50 ohm-cm., p-type silicon disk placed in the typical laboratory apparatus shown in FIG. 1 with an oxygen pressure of 0.5 mm. Hg, with the microwave power at 300 watts and with a direct-current bias over electrodes 2 and 3 of approximately 70 volts.

The preferred range for the extracting potential is 10 to 150 volts. Above 150 volts the cathode begins to sputter badly and will disintegrate. The high potential will also cause the silicon device to be bombarded by high energy ions which cause damage and affect the electrical characteristics of the device. The elimination of high energy ion bombardment is one of the important advantages gained in using a microwave discharge rather than a discharge supported by high voltage electrodes within the tube. Below 10 volts the oxidation proceeds at an impractically slow rate.

Various other modifications and extensions of this invention will become apparent to those skilled in the art. All such variations and deviations which basically rely on the teachings through which this invention has advanced the art, are properly considered within the spirit and scope of this invention.

What is claimed is:

1. A method of growing an oxide film on a silicon surface which comprises contacting two electrodes with a glow discharge of oxygen gas inside a sealed container, one of said electrodes having a silicon substrate in contact therewith, said glow discharge being supported by a microwave source adjacent to and outside of said sealed container, the pressure of said oxygen gas inside said container being in the range from 0.01 mm. Hg to 10 mm. Hg, the saturation current density within said glow discharge being in the range from 0.1 ma./cm.$^2$ to 100 ma./cm.$^2$, and passing a direct current across said electrodes such that the silicon substarte is anodic, the magnitude of the bias across said electrodes being less than 150 volts.

2. The method of claim 1 wherein said sealed container comprises quartz.

3. The method of claim 2 wherein both of said electrodes comprise silicon.

4. The method of claim 1 wherein the magnitude of the bias across the electrodes is at least 10 volts.

5. The method of claim 1 wherein the silicon surface includes a junction between regions of differing conductivity types.

6. The method of claim 5 wherein the silicon surface is part of a semiconductor device having an electrical lead attached to at least one of the regions.

References Cited

UNITED STATES PATENTS 3,108,900 11/1963 Papp -------------- 117—93.1

FOREIGN PATENTS 659,813 5/1938 Germany.
900,334 7/1962 Great Britain.

ALFRED L. LEAVITT, *Primary Examiner.*

WILLIAM L. JARVIS, *Examiner.*